(12) United States Patent
Hosaka et al.

(10) Patent No.: US 8,310,261 B2
(45) Date of Patent: *Nov. 13, 2012

(54) PROBING APPARATUS AND PROBING METHOD

(75) Inventors: Hiroki Hosaka, Nirasaki (JP); Shuji Akiyama, Nirasaki (JP); Tadashi Obikane, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 638 days.

This patent is subject to a terminal disclaimer.

(21) Appl. No.: 12/488,186

(22) Filed: Jun. 19, 2009

(65) Prior Publication Data

US 2009/0267626 A1    Oct. 29, 2009

Related U.S. Application Data

(62) Division of application No. 11/747,559, filed on May 11, 2007, now Pat. No. 7,583,096.

(30) Foreign Application Priority Data

| May 11, 2006 | (JP) | ................................ 2006-132546 |
| Feb. 23, 2007 | (JP) | ................................ 2007-044729 |
| Apr. 20, 2007 | (JP) | ................................ 2007-112347 |

(51) Int. Cl.
*G01R 31/20* (2006.01)
*G01R 31/10* (2006.01)

(52) U.S. Cl. ............................. 324/757.01; 324/750.14

(58) Field of Classification Search .. 324/750.01–750.3, 324/762.01–762.09, 754.01–754.29, 756.01–756.02, 324/757.01–757.05; 257/48; 438/14–18

See application file for complete search history.

(56) References Cited

U.S. PATENT DOCUMENTS

| 5,857,827 A | 1/1999 | Asakawa et al. |
| 6,042,324 A | 3/2000 | Aggarwal et al. |
| 6,409,448 B1 | 6/2002 | Sindledecker |
| 6,540,869 B2 | 4/2003 | Saeki et al. |

(Continued)

FOREIGN PATENT DOCUMENTS

JP    7-27933    3/1995

OTHER PUBLICATIONS

Office Action mailed Jul. 19, 2010, in co-pending U.S. Appl. No. 11/747,646.

*Primary Examiner* — Tung X Nguyen
(74) *Attorney, Agent, or Firm* — Oblon, Spivak, McClelland, Maier & Neustadt, L.L.P.

(57) ABSTRACT

There is provided a probing apparatus capable of modifying an existing probing apparatus having a single loading port to one having dual loading ports while saving the space without increasing a foot print thereof and also capable of increasing an inspection efficiency by cooperating with an automatic transfer line for the apparatus having a single loading port. The probing apparatus includes a prober chamber in which a wafer is inspected and a loader chamber having: a first and a second loading ports positioned to be spaced apart from each other at the side of a prober chamber, each of the loading ports mounting thereon a cassette accommodating therein a plurality of waters; and a wafer transfer unit for transferring the wafers between the loading ports and the prober chamber. The loading ports are arranged along a route where the cassette is transferred by an automatic transfer device.

20 Claims, 10 Drawing Sheets

U.S. PATENT DOCUMENTS

| | | | |
|---|---|---|---|
| 6,572,321 B1 | 6/2003 | Nulman | |
| 6,610,993 B2 | 8/2003 | Meyhofer et al. | |
| 6,641,350 B2 | 11/2003 | Nakashima et al. | |
| 6,655,891 B2 | 12/2003 | Ueda et al. | |
| 6,769,861 B2 | 8/2004 | Caveney | |
| 6,831,296 B1 * | 12/2004 | Lee et al. | 257/48 |
| 6,844,717 B2 * | 1/2005 | Jeon et al. | 324/750.13 |
| 6,919,734 B2 * | 7/2005 | Saito et al. | 324/750.09 |
| 6,981,832 B2 | 1/2006 | Zinger et al. | |
| 7,257,494 B2 | 8/2007 | Conner et al. | |
| 7,419,346 B2 | 9/2008 | Danna et al. | |
| 7,583,096 B2 * | 9/2009 | Hosaka et al. | 324/755.11 |
| 7,585,142 B2 | 9/2009 | Aggarwal et al. | |
| 7,604,449 B1 | 10/2009 | Kaveh | |
| 2002/0037645 A1 | 3/2002 | Matsunaga et al. | |
| 2003/0091409 A1 | 5/2003 | Danna et al. | |
| 2005/0063799 A1 | 3/2005 | Larson et al. | |
| 2006/0045663 A1 | 3/2006 | Aggarwal et al. | |

* cited by examiner

PROBING APPARATUS AND PROBING METHOD

CROSS-REFERENCE TO RELATED APPLICATIONS

The present application is a divisional application of and claims priority to U.S. application Ser. No. 11/747,559, filed on May 11, 2007 now U.S. Pat. No. 7,583,096, of which the entire content is hereby incorporated by reference, with the present application also claiming priority to predecessors of the '559 application as follows. U.S. application Ser. No. 11/747,559 is based upon and claims the benefit of priority from prior Japanese Applications JP 2006-132546, filed on May 11, 2006, JP 2007-044729, filed on Feb. 23, 2007, and JP 2007-112347, filed on Apr. 20, 2007

FIELD OF THE INVENTION

The present invention relates to a probing apparatus and method; and, more particularly, to a probing apparatus and method capable of saving a space and increasing an inspection efficiency.

BACKGROUND OF THE INVENTION

A conventional probing apparatus of such a type, as shown in FIG. 13A for example, includes a loader chamber 1 and a prober chamber 2 adjacent thereto, wherein wafers are transferred from the loader chamber 1 to the prober chamber 2 for performing an electrical characteristic inspection thereon and then returned the inspected wafers to the loader chamber 1. The loader chamber 1 has, e.g., a loading port 3, a wafer transfer mechanism 4 and a pre-alignment mechanism (sub-chuck) 5. Further, the prober chamber 2 has a wafer chuck 6, an alignment mechanism (not shown) and a probe card (not shown). Moreover, a cassette for accommodating therein a plurality of wafers is mounted on the loading port 3 of the loader chamber 1. In the loader chamber 1, the wafer transfer mechanism 4 is driven to transfer wafers sheet by sheet from the cassette. While being transferred, the wafers are pre-aligned by the sub-chuck 5. Then, the pre-aligned wafers are transferred by the wafer transfer mechanism 4 to the wafer chuck 6 of the prober chamber 2. In the prober chamber 2, the wafer chuck 6 moves horizontally and vertically, and the wafers on the wafer chuck 6 are subjected to an electrical characteristic inspection by the probe card. Next, the inspected wafers are returned to their original positions in the cassette via a reverse path. In a probing apparatus for inspecting wafers sheet by sheet, the wafers are loaded sheet by sheet into the loader chamber for an electrical characteristic inspection.

As for a probing apparatus, there has been widely used a probing apparatus having a single loading port as illustrated in FIG. 13A, wherein the loader chamber 1 is disposed at the right or left side of the prober chamber 2 (at the right side in FIG. 13A) and a single loading port 3 is provided at the front side in the loader chamber 1, i.e., at a front surface side of the probing apparatus.

As for another probing apparatus, there has been known a probing apparatus having dual loading ports, which is disclosed in Japanese Patent Laid-open Publication No. S63-081830 (Reference Document 1). In this probing apparatus, a loader chamber respectively having at the right and the left side thereof two loading ports is provided at the front side of the probing apparatus.

The conventional probing apparatus having a single loading port is unable to cope with a recent trend for a high inspection speed for example. Therefore, there is an increasing demand for the probing apparatus having dual loading ports capable of processing wafers in two cassettes consecutively. Accordingly, there arises a need to replace the conventional probing apparatus having a single loading port with the probing apparatus having dual loading ports of Patent Document 1.

However, unlike the loader chamber disposed at the right or left side of the probing apparatus in the conventional probing apparatus having a single loading port, the loader chamber is provided at the front side of the prober chamber to ensure a space for an inker of a marking mechanism in the probing apparatus having dual loading ports of Reference Document 1. In such a configuration, due to an operator manipulating the apparatus at the front side thereof, a wafer transfer line cannot be disposed at the front side of the apparatus and thus the transfer line should be provided at the right or left side of the apparatus, respectively, so that there are various restrictions in modifying the conventional probing apparatus having a single loading port to one having dual loading ports. Accordingly, it is difficult to realize an automatic transfer of wafer between the transfer line and the loader chamber. For example, when the loading port 3 of the probing apparatus shown in FIG. 13A needs to be extended, an additional loading port 3A is provided at a side thereof as shown in FIG. 13B since the sub-chuck 5 is still needed. As a result, a foot print thereof increases.

However, a foot print of an existing probing apparatus may not be further increased due to a limited space in relation with another probing apparatus or the like. Moreover, since the transfer line for automatically transferring wafers has been built to be adapted to the probing apparatus having a single loading port, the foot print is not allowed to be increased when modifying the probing apparatus having a single loading port to one having dual loading ports and, hence, a demand to save the space of the loader chamber is increased.

SUMMARY OF THE INVENTION

It is, therefore, an object of the present invention to provide a probing apparatus capable of modifying an existing probing apparatus having a single loading port to one having dual loading ports while saving the space without increasing a foot print thereof and also capable of increasing an inspection efficiency by cooperating with an automatic transfer line for the apparatus having a single loading port.

In accordance with an first aspect of the present invention, there is provided a probing apparatus including: a prober chamber in which target objects are inspected; and a loader chamber disposed at a side surface of the processing chamber, wherein the loader chamber includes: two loading ports positioned to be spaced apart from each other along the side surface, each of the loading ports mounting thereon a cassette accommodating therein a plurality of the target objects; and a transfer unit provided between the loading ports, the transfer unit transferring the target objects between the loading ports and the prober chamber, wherein the loading ports are disposed along a route where the cassette is transferred by an automatic transfer device.

Preferably, each of the loading ports has a direction switching mechanism for switching a direction of the cassette.

Preferably, each of the loading ports is provided with a sensor for detecting target objects protruded from the cassette.

Preferably, each of the loading ports is provided with a pressing member for pushing the target objects protruded from the cassette thereinto.

Preferably, the cassette has a lid for closing a loading/unloading opening for the target objects, and each of the loading ports is provided with an opening/closing mechanism for opening and closing the lid of the cassette.

In accordance with another aspect of the present invention, there is provided a probing apparatus including: a prober chamber in which target objects are inspected; and a loader chamber disposed at a side surface of the processing chamber, wherein the loader chamber includes: two loading ports provided near the side surface to be vertically spaced apart from each other, each of the loading ports mounting thereon a cassette accommodating therein a plurality of the target objects; and a transfer unit provided between the loading ports, the transfer unit transferring the target objects between the loading ports and the prober chamber, wherein each of the loading ports has a direction switching mechanism for switching a direction of the cassette and an opening/closing mechanism for opening and closing a lid of the cassette facing the transfer unit through the direction switching mechanism.

Preferably, the loading ports are disposed along a route where the cassette is transferred by an automatic transfer device.

Preferably, a positioning mechanism for positioning the target objects is provided under any one of the two loading ports.

Preferably, the direction switching mechanism has a mounting portion for mounting thereon the cassette; and a rotational body for rotating the mounting portion, wherein a center of the target objects in the cassette is offset from a center of the rotational body by a specific distance, and the mounting portion is eccentrically rotated by the rotational body.

Preferably, when the rotational body is rotated to make the lid of the cassette face the opening/closing mechanism, the cassette becomes closer to a position where it is opened and closed by the opening/closing mechanism by the specific distance.

Preferably, the rotational body is rotatable by 90°.

Preferably, an identification unit for identifying the target objects is provided near the positioning mechanism.

Preferably, a receiving body having supporting portions for supporting same-sized substrates is provided under the other one of the two loading ports, the supporting portions being arranged in multiple stages vertically.

Preferably, each of the supporting portions has a sensor for detecting presence of the substrate.

Preferably, the transfer unit has a first and a second elevation driving mechanism.

Preferably, the first elevation driving mechanism has an air cylinder, and the second elevation driving mechanism has a motor.

In accordance with still another aspect of the present invention, there is provided a method for probing target objects by using a probing apparatus including a prober chamber in which the target objects are inspected and a loader chamber disposed at a side surface of the processing chamber, the loader chamber having two loading ports positioned to be spaced apart from each other along the side surface, each of the loading ports mounting thereon a cassette accommodating therein a plurality of the target objects, the method including the step of: performing an inspection of the target objects in the cassette mounted on one of the loading ports while transferring another cassette between the other loading port and an automatic transfer device moving along a transfer route arranged along a side of the loader chamber.

In accordance with the present invention, there can be provided a probing apparatus capable of modifying an existing probing apparatus having a single loading port to one having dual loading ports while saving the space without increasing a foot print thereof and also capable of increasing the inspection efficiency by cooperating with an automatic transfer line for the apparatus having a single loading port.

BRIEF DESCRIPTION OF THE DRAWINGS

The above and other objects and features of the present invention will become apparent from the following description of embodiments, given in conjunction with the accompanying drawings, in which:

FIGS. 11A and 11B show a buffer table and a wafer table, both being used in the loader chamber of FIG. 10, wherein FIG. 11A presents a top view of the buffer table and the wafer table, and FIG. 11B represents an enlarged cross sectional view of principal parts in the buffer table;

DETAILED DESCRIPTION OF THE EMBODIMENTS

Hereinafter, the present invention will be described based on embodiments illustrated in FIGS. 1 to 12. In the following embodiments, as an example of a processing apparatus, there will be described a probing apparatus for inspecting electrical characteristics of target objects.

First Embodiment

Figure 1:
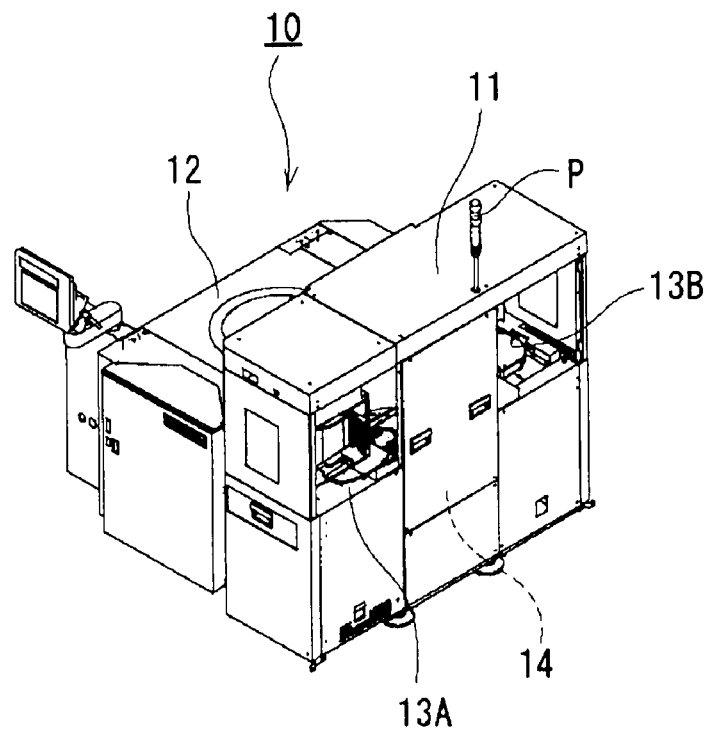
FIG. 1 is a perspective view of a probing apparatus in accordance with an embodiment of a processing apparatus of the present invention.
Figure 2:
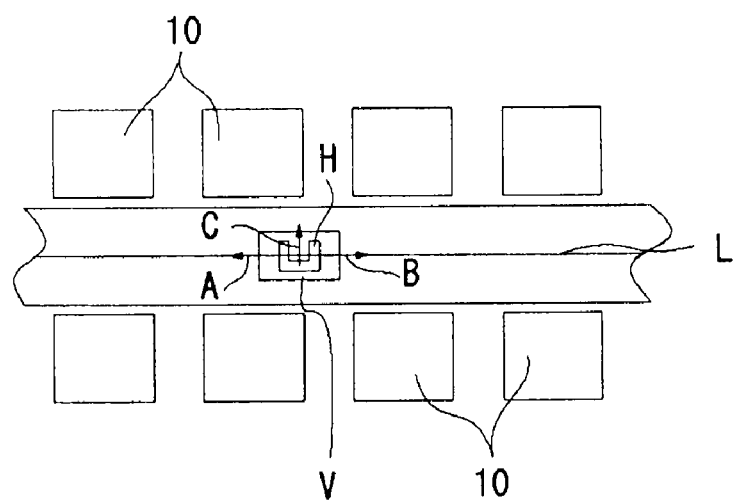
FIG. 2 shows a top view illustrating a layout in a clean room of the probing apparatus of FIG. 1.

As shown in FIG. 1, a probing apparatus 10 of this embodiment includes a loader chamber 1 for transferring target objects (e.g., wafers); and a prober chamber 2 for inspecting electrical characteristics of the wafers, the loader chamber 11 being disposed at a side of the prober chamber 12. The loader chamber 11 has a first and a second loading port 13A and 13B provided at a front and a rear side, each for mounting thereon a cassette (not shown) accommodating therein a plurality of wafers; and a wafer transfer unit (see FIG. 3) disposed between the first and the second loading ports 13A and 13B. Each of the components is driven under the control of a controller (not shown). As depicted in FIG. 2, a plurality of probing apparatuses 10 are arranged at both sides of a transfer line L provided inside a clean room. In this embodiment, the loader chamber 11 having at its front and rear side the first and the second loading port 13A and 13B is obtained by modifying a conventional loader chamber having at its front side a single loading port. In that case, a foot print is substantially same as that of the conventional probing apparatus. Moreover, it is possible to realize a complete automation from a wafer cassette transfer to a wafer inspection by expanding a function of the loader chamber 11 without increasing the foot print and also by utilizing the existing transfer line L corresponding to the probing apparatus 10 as it is.

As illustrated in FIG. 2, an automatic transfer device V can move along the transfer line L in arrow directions A and B and also transport, at a side of a specific probing apparatus 10, a cassette (not shown) to the loading port 13 of the probing apparatus 10 in an arrow direction C by using a cassette arm H. The cassette may be transported by an operator to the first and the second loading port 13A and 13B. In FIG. 1, a downwardly inclined lower surface of the probing apparatus 10 is defined as a front surface. That is, in this embodiment, the loader chamber 11 is disposed at the right side of the prober chamber 12.

Figure 3:
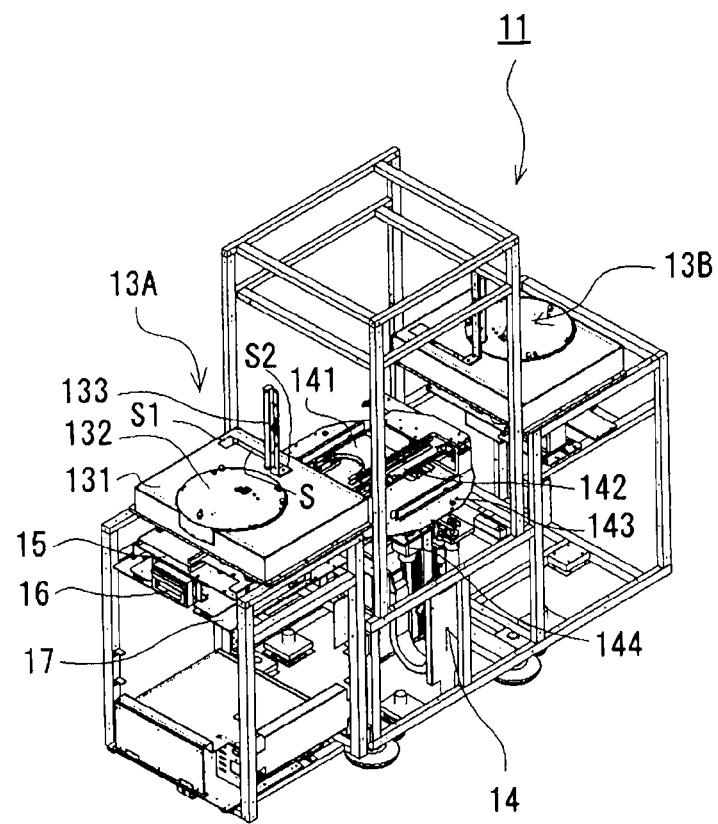
FIG. 3 provides a perspective view of an interior of a loader chamber of the probing apparatus of FIG. 1.
Figure 4:
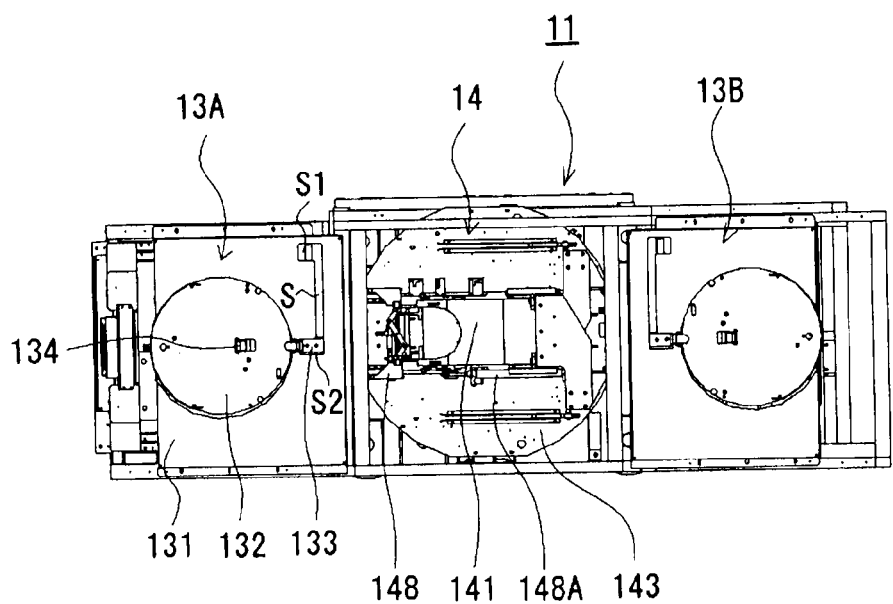
FIG. 4 depicts a top view of the loader chamber of FIG. 3.
Figure 5:
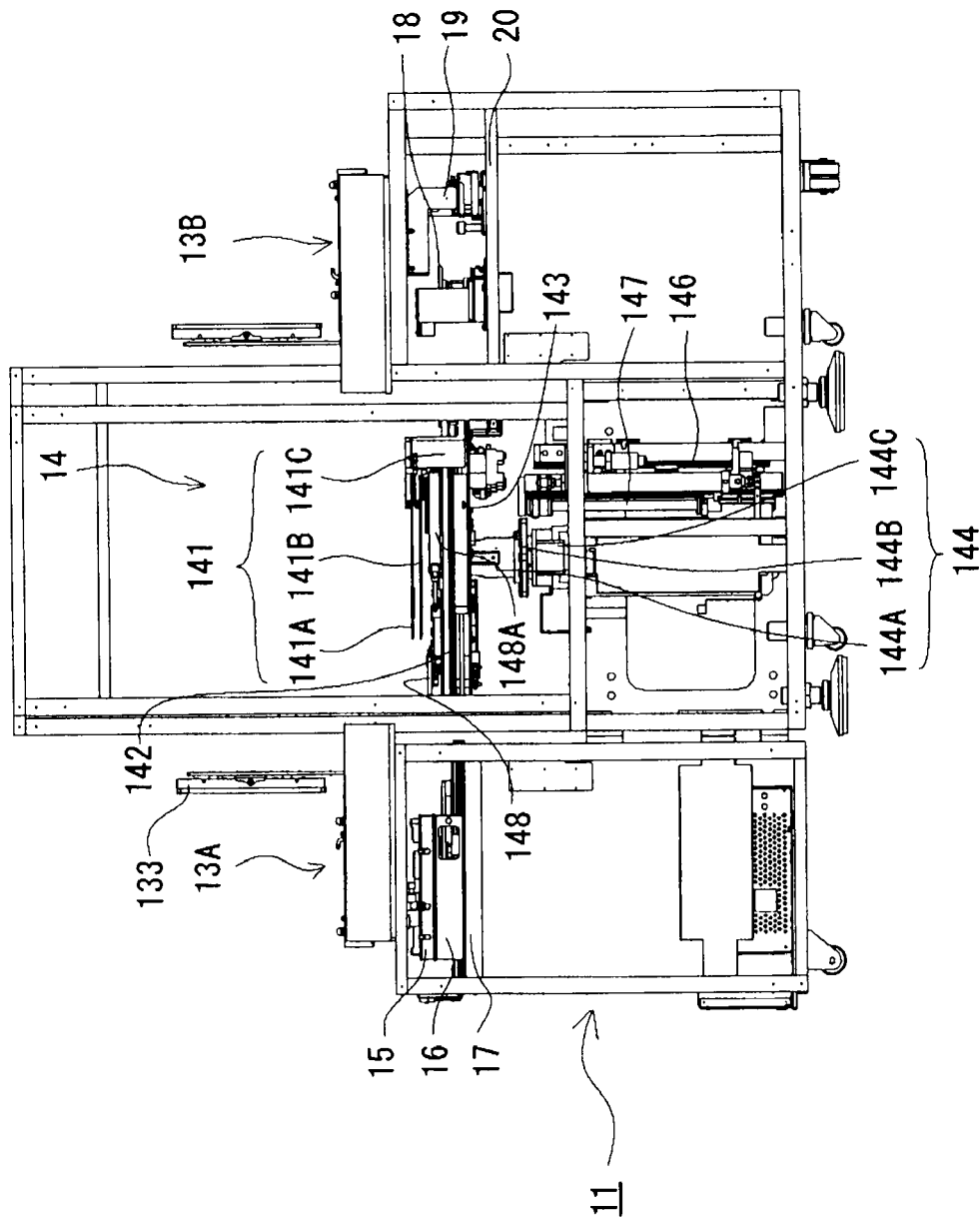
FIG. 5 describes a side view of the loader chamber of FIG. 3.

The first and the second loading ports 13A and 13B, respectively provided at the front and the rear side, have the same configuration and are arranged opposite to each other with the wafer transfer unit 14 disposed therebetween, as described in FIGS. 3 to 5. As shown in FIGS. 3 to 5 for example, the first loading port 13A has a direction switching mechanism for switching a direction of the cassette. The direction switching mechanism includes a base 131; a turntable 132 provided at the base 131, for mounting thereon the cassette; a rotational driving mechanism (not shown) provided inside the base 131, for rotating the turntable 132; and a pressing member 133 for pushing wafers partially protruded from the cassette after the rotation into the cassette. The turntable 132 is rotated by 90° forwardly and backwardly through the rotational driving mechanism such that a loading/unloading opening of the cassette is made to face the prober chamber 12 and the wafer transfer chamber 14.

Provided at the prober chamber 12 of the base 131 is an optical sensor (not shown) for detecting wafers partially protruded from the cassette, the optical sensor being located to be separated from the turntable 132. The optical sensor detects whether or not the protruded wafers can be pushed into the cassette by the pressing member 133. In case the wafers cannot be pushed into the cassette by the pressing member 133, an alarm is given by a signal tower P (see FIG. 1) or the like.

As shown in FIG. 4, the turntable 132 is provided with a lock mechanism 134 for fixing the cassette. When the cassette is mounted on the turntable 132, the lock mechanism 134 is driven to fix the cassette on the turntable 132. The base 131 has a slit S formed in its top surface near the wafer transfer unit 14, the slit S extending from an end portion near the prober chamber 12 toward the transfer line L up to a central portion of the base 131. Further, a first and a second short slit S1 and S2 are extending from both ends of the slit S toward the front side (the left side in FIG. 4). The pressing member 133 is installed upright in such a way that it can reciprocate along the slit S between the first short slit S1 and the second short slit S2. The pressing member 133 moves from the first short slit S1 to the second short slit S2 and then moves along the second short slit S2 toward the cassette to push the wafers partially protruded from the cassette thereinto, so that the wafers are returned to their original positions inside the cassette. Further, when the loading/unloading opening is made to face the wafer transfer unit 14 by rotating the cassette via the turntable 132, the pressing member 133 is automatically driven to push the wafers into the cassette.

As illustrated in FIGS. 3 and 5, the buffer table 15 and the wafer table 16 are arranged vertically under the first loading port 13A and supported by a supporting body 17. The buffer table 15 is a table for accommodating therein substrates, e.g., needle-tip grinding wafers and the like. The wafer table 16 is a retreatable table for taking inspected wafers out of the apparatus to check the inspected wafers. The buffer table 15 has on both side inner walls thereof, when viewed from the front side, slots arranged vertically to support needle-tip grinding wafers of different sizes (e.g., 200 mm φ and 300 mm φ). Accordingly, the needle-tip grinding wafers of different sizes or the like can be accommodated in the slots.

In addition, as depicted in FIG. 5, a sub-chuck 18 for pre-aligning wafers and an information reader 19 for reading identification information of wafers are provided under the second loading port 13B and they are supported by the supporting body 20. As for the information reader 19, there is known, e.g., an optical character reader (OCR), a barcode reader or the like. Since the OCR is used in this embodiment, the OCR 19 will be described as the information reader 19 hereinafter.

Figure 6:
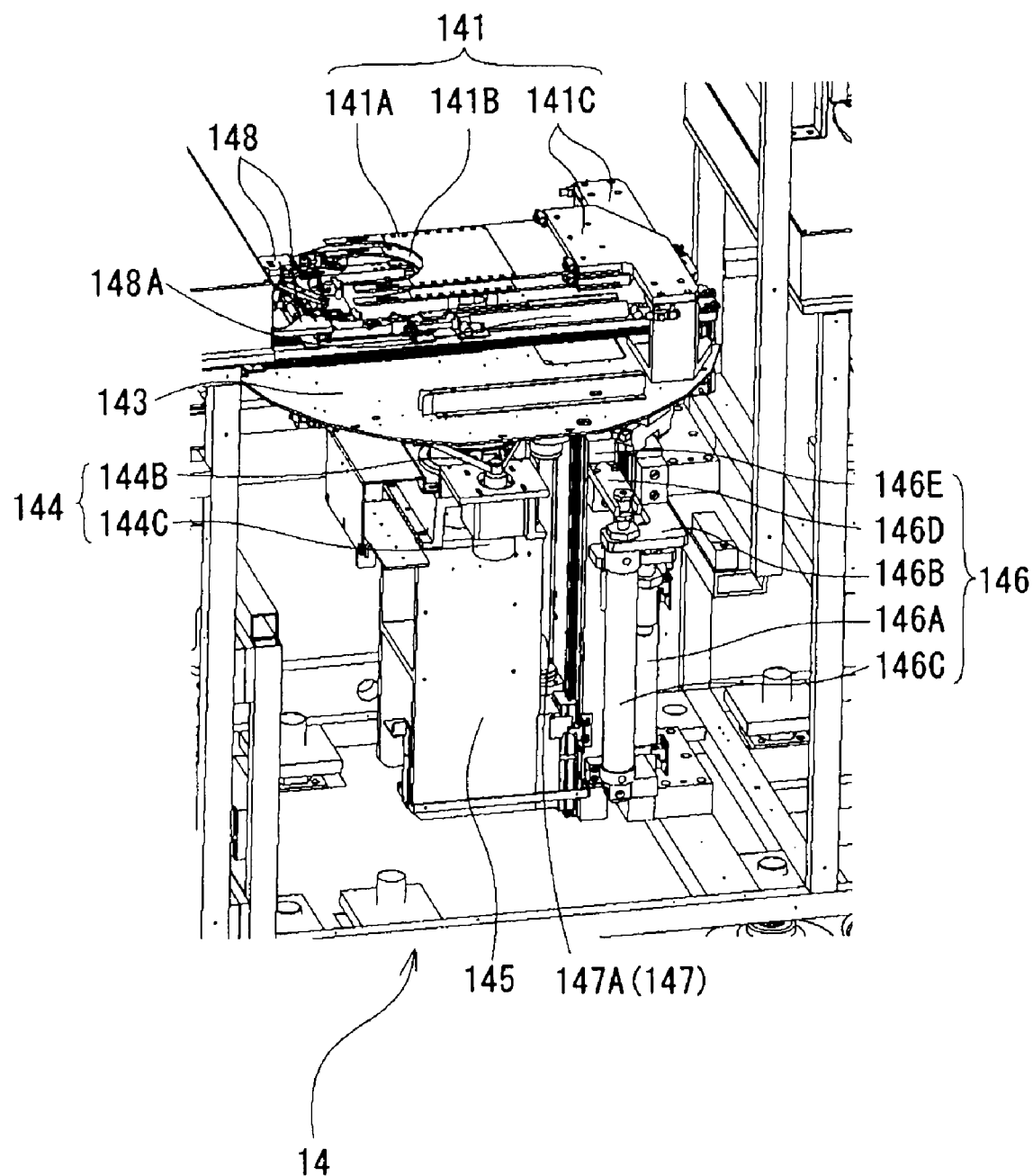
FIG. 6 presents a side view of a linear driving mechanism of a wafer transfer unit of FIG. 3.

As shown in FIGS. 3 to 7, the wafer transfer unit 14 has a transfer arm for transferring wafers; a linear driving mechanism 142 including a motor for moving the transfer arm 141 forwardly/backwardly and an endless belt; a disc-shaped rotation plate 143 on which the transfer arm 141 and the linear driving mechanism 142 are installed; a rotational driving mechanism 144 connected with a center of a bottom surface of the rotation plate 143, for rotating the transfer arm 141 forwardly/backwardly via the rotation plate 143; a base 145 (see FIG. 6) for supporting the transfer arm 141, the linear driving mechanism 142, the rotation plate 143 and the rotational driving mechanism 144; and a first and a second elevation driving mechanism 146 and 147 for moving up and down the transfer arm 141 via the base 145. Besides, as depicted in FIGS. 4 to 6, a pair of mapping sensors 148 is provided at a peripheral edge of the rotation plate 143 in front of and slightly below the transfer arm 141. The mapping sensors 148 can move forwardly/backwardly by a linear driving mechanism 148A including a cylinder mechanism as a main unit to detect a state of the wafers accommodated (the number of wafers or the like) before the wafers are unloaded from the cassette.

Figure 7:
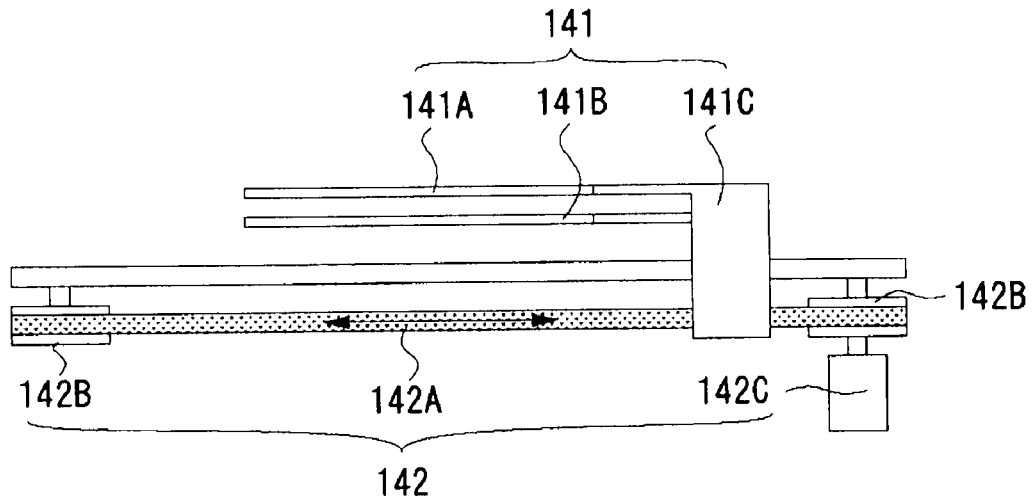
FIG. 7 represents a perspective view of the wafer transfer unit of FIG. 5.

As can be seen from FIGS. 5 to 7, the transfer arm 141 has a first and a second arm 141A and 141B arranged vertically; and two supporting bodies 141C for supporting the first and the second arm 141A and 141B at base end portions thereof, respectively, the first and the second arm 141A and 141B being spaced apart from each other by a specific gap. The transfer arm 141 is connected with the linear driving mechanism 142 via the supporting bodies 141C. As shown in FIG. 7, the linear driving mechanism 142 has, e.g., an endless belt 142A disposed on a plate and connected with the supporting bodies 141C; front and rear pulleys 142B on which the endless belt 142A is wound; a guide rail (not shown) for moving the transfer arm 141 forwardly/backwardly; and a motor 142C connected with the rear pulley 142B. The linear driving mechanism 142 allows the transfer arm 141 to move forwardly/backwardly along the guide rail by a driving force of the motor 142C.

Besides, as can be seen from FIGS. 5 and 6, the rotational driving mechanism 144 has a rotation shaft 144A extending downward from the center of the bottom surface of the rotation plate 143; and a motor 144C fixed on the base 145 and connected with the rotation shaft 144A via an endless belt 144B. The motor 144C rotates forwardly/backwardly such that the transfer arm 141 on the rotation plate 143 is made to face the first and the second loading port 13A and 13B or the prober chamber 12. The rotation shaft 144A is rotatably supported by the base 145.

Figure 8:
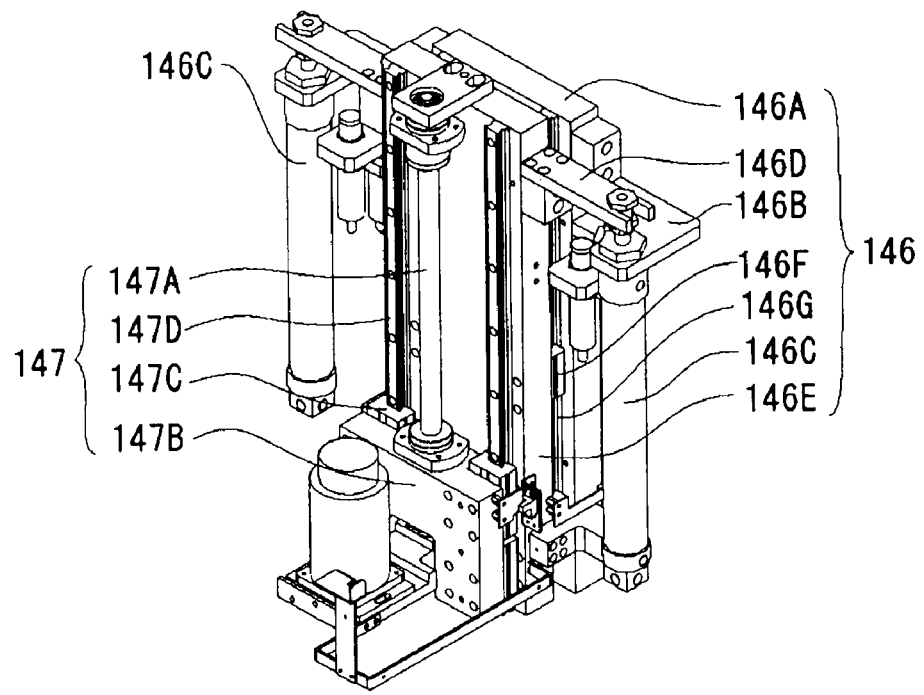
FIG. 8 offers a perspective view of an elevation driving mechanism of the wafer transfer unit of FIG. 7.

As illustrated in FIGS. 6 and 8, an elevation driving mechanism of the transfer arm 141 has a first and a second elevation driving mechanism 146 and 147 for individually moving up and down the transfer arm 141 on the base 145.

As depicted in FIGS. 6 and 8, the first elevation driving mechanism 146 has a first guide plate 146A fixed on a bottom surface of the loader chamber 11; a pair of cylinder mechanisms 146C provided at both sides of the first guide plate 146A and having leading end portions connected with a cylinder main body via first coupling members 146B; and a second guide plate 146E connected with rods of the cylinder mechanisms 146C via second coupling members 146D. When the rods of the cylinder mechanisms 146C are extended/contracted, the second guide plate 146E is raised/lowered along the first guide plates 146A. Further, engaging members 146F of the second guide plate 146E are engaged with guide rails 146G of the first guide plate 146A.

Further, as can be seen from FIGS. 6 and 8, the second elevation driving mechanism 147 has a ball screw 147A disposed at a front side of the second guide plate 146E; an elevation body 147B accommodating therein a nut member to be screwed with the ball screw 147A; and a motor (not shown) for rotating the ball screw 147A forwardly/backwardly under the elevation body 147B. By rotating the ball screw 147A forwardly/backwardly, the elevation body 147B is raised/lowered along the second guide plate 146E. Engaging members 147C of the elevation body 147B are engaged with guide rails 147D of the second guide plate 146E. Moreover, the elevation body 147B is formed as a unit with the base 145 (see FIG. 6) for supporting the transfer arm 141 and the like, thus moving up and down the transfer arm 141.

By driving the cylinder mechanisms 146C, the first elevation driving mechanism 146 moves up and down the wafer transfer unit 141 together with the second elevation driving mechanism 147 between its lowermost position and the lower positions of the first and the second loading port 13A and 13B. Further, by driving the motor, the second elevation driving mechanism 147 slightly moves up and down the wafer transfer unit 141 in its lower position when pre-aligning the wafers under the second loading port 13B, or slightly moves up and down the wafer transfer unit 141 so that wafers can be randomly unloaded sheet by sheet from the cassettes on the first and the second loading port 13A and 13B.

Hereinafter, an operation will be explained. First of all, the automatic transfer vehicle V having thereon a cassette accommodating therein, e.g., 25 wafers, moves along the transfer line L and then faces the first loading port 13A of a specific probing apparatus 10. Next, the cassette arm H of the automatic transfer vehicle V is driven to transport the cassette onto the turntable 132 of the first loading port 13A. At this time, the loading/unloading opening of the cassette faces the prober chamber 12. After the cassette is transported, the automatic transfer vehicle V transports a next cassette.

When the cassette is transported from the automatic transfer vehicle V onto the turntable 132, the wafers may be protruded from the cassette due to an inertial force. Therefore, the optical sensor in the loading port 13A is actuated to detect whether or not wafers partially protruded from the cassette can be pushed into the cassette. If it is determined by the optical sensor that the wafers cannot be pushed into the cassettes, an alarm is given to the operator by turning on/off the signal tower P for example. Based on the alarm, the operator pushes the wafers into their original positions inside the cassette. Meanwhile, if it is determined by the optical sensor that the wafers can be pushed into the cassette, the rotational driving mechanism of the turntable 132 is driven to rotate the turntable 132 by an angle of 90° in a clockwise direction. Accordingly, the loading/unloading opening of the cassette is made to face the wafer transfer unit 14.

When the loading/unloading opening of the cassette is made to face the wafer transfer unit 14, the wafers may be partially protruded from the cassette. Therefore, when the loading/unloading opening of the cassette faces the wafer transfer unit 14, the pressing member 133 moves from the first short slit S1 to the second short slit S2 via the slit S and then moves along the second short slit S2 toward the cassette, thereby pushing the wafers into the cassette. Thereafter, the pressing member 133 returns to the first short slit S1 via a reverse path.

When the pressing member 133 returns to its original position, the wafer transfer unit 14 is driven. At this time, the first elevation driving mechanism 145 is driven first, and the second guide plate 146E is raised from a lowermost position to an uppermost position along the guide rail 146G of the first guide plate 146A, thus reaching a position where a lowermost wafer in the cassette on the first loading port 13A can be taken out. Thereafter, the second elevation driving mechanism 147 is driven to rotate the ball screw 147A, and the elevation body 147B is raised together with the base 145 through the nut member. Accordingly, the transfer arm 141 is raised from a bottom stage to a top stage of the cassette. At this time, the mapping sensors 148 detect the receiving state of the wafers in the cassette. Next, the motor of the second elevation driving mechanism 147 rotates in a reverse direction, and the transfer arm 141 is lowered via the ball screw 147A, thus moving to a position where it takes a specific wafer out from the cassette. In addition, the mapping sensors 148 may detect the wafers while the transfer arm 141 is moving from the bottom stage to the top stage of the cassette, or may detect the wafers twice while the transfer arm 141 is reciprocating between the top and the bottom stage of the cassette.

Then, the motor 142C of the linear driving mechanism 142 is driven, and the transfer arm 141 supported by the supporting bodies 141C is driven via the endless belt 142A. The transfer arm 141 moves forward from a rear end and then into the cassette on the first loading port 13A, so that the first arm 141A, for example, is positioned under a desired wafer. At this time, the second elevation driving mechanism 147 is driven, and the transfer arm 141 is slightly raised so that the wafer can be adsorptively held by the first arm 141A. In this case, the wafer is accommodated in its original position by the pressing member 133 and is thus prevented from being released from the first transfer arm 141A. Next, the transfer arm 141 returns to the rear end, and the wafer is unloaded from the cassette by the first arm 141A.

Next, the first elevation driving mechanism 146 is driven, and the rods of the cylinder mechanisms 146C are contracted. Accordingly, the transfer arm 141 is lowered between the first and the second loading port 13A and 13B. Thereafter, the motor 144C of the rotational driving mechanism 144 is driven to rotate the rotation plate 143 by 180° via the endless belt 144B and the rotation shaft 144A. As a consequence, the leading end of the transfer arm 141 is made to face the second loading port 13B. Then, the motor 142C of the linear driving mechanism 142 is driven, so that the transfer arm 141 supported by the supporting bodies 141C via the endless belt 142A moves toward the sub-chuck 5 disposed under the second loading port 13B. At this time, the ball screw 147A of the second elevation driving mechanism 147 is driven in clockwise and counterclockwise directions, thereby moving up and down the transfer arm 141. The identification information of the wafers supported by the first arm 141A is read by the OCR 19 and, then, the wafer is mounted on the sub-chuck 18 by the first arm 141A. Next, the sub-chuck 18 rotates, and the wafer is pre-aligned by orientation flats or the like. Thereafter, the ball screw 147A of the second elevation driving mechanism 147 rotates, and the wafer is adsorptively held by the transfer arm 141A and then lifted from the sub-chuck 18. Next, the transfer arm 141 is retreated from the sub-chuck 18 to the rear end on the rotation plate 143 via the linear driving mechanism 142.

When the transfer arm 141 returns to the rear end on the rotation plate 143, the rotation plate 143 rotates by 90° in a counterclockwise direction via the rotational driving mechanism 144. Accordingly, the leading end of the transfer arm 141 is made to face the prober chamber 12. Next, the transfer arm 141 is moved above a wafer chuck (not shown) inside the prober chamber 12 through the linear driving mechanism 142, and the transfer arm 141 is raised/lowered through the second elevation driving mechanism 147 to thereby deliver an unprocessed wafer from the first arm 141A to the wafer chuck. Thereafter, the transfer arm 141 is retreated from the prober chamber 12 to the rear end through the linear driving mechanism 142.

After the wafer is subjected to the inspection inside the prober chamber 12, the transfer arm 141 moves into the prober chamber 12 through the linear driving mechanism 142 and, then, the second arm 141B receives the processed wafer through the second elevation driving mechanism 147. Thereafter, the transfer arm 141 moves from the prober chamber 12 to the rear end on the rotation plate 143. Next, the transfer arm 141 rotates by 90° in a counterclockwise direction through the rotational driving mechanism 144, so that the leading end of the transfer arm 141 is made to face the first loading port 13A. Further, the transfer arm 141 is raised through the first and the second elevation driving mechanism 146 and 157 and then moves into the cassette through the linear driving mechanism 142 to thereby return the processed wafer from the second arm 141B to its original position inside the cassette. Next, the transfer arm 141 moves from the cassette to the rear end through the linear driving mechanism 142. Thereafter, the second elevation driving mechanism 147 is driven to raise/lower the transfer arm 141 to a position of a next wafer. When the next wafer is unloaded, the aforementioned series of operations are repeatedly performed. In this manner, all of the wafers in the cassette undergo the electrical characteristic inspection.

While the wafers in the cassette are being processed, the automatic transfer vehicle V transports the cassette to the empty second loading port 13B. After all of the wafers in the cassette on the first loading port 13A are subjected to the electrical characteristic inspection, the turntable 132 rotates by 90° counterclockwise and, thus, the loading/unloading opening of the cassette is made to face the prober chamber 12. Then, the cassette arm H of the automatic transfer vehicle V that has been waiting is driven, so that the cassette on the first loading port 13A is transferred to a next process by the automatic transfer vehicle V. At this time, the wafers in the cassette on the second loading port 13B are processed in the loader chamber 11 and the prober chamber 12.

As described above, in accordance with this embodiment, the loader chamber 11 is disposed at a side of the prober chamber 12. Further, the first and the second loading port 13A and 13B are respectively provided at the front and the rear side in the loader chamber 11 and along the automatic transfer line L of the probing apparatus having a single loading port. Accordingly, the existing probing apparatus having a single loading port can be modified to one having dual loading ports without increasing a foot print thereof while saving a space. Moreover, it is possible to increase the inspection efficiency in cooperation with the automatic transfer line L for the apparatus having a single loading port.

Further, since the first and the second loading port 13A and 13B are arranged along the automatic transfer line L of the automatic transfer device V, even while the operator is at the front side of the probing apparatus 10 and when the wafers in the cassette mounted on, e.g., the first loading port 13A of the probing apparatus 10 are inspected, the cassette can be delivered between the automatic transfer device V and the second loading port 13B without being interfered with the operator.

When the first and the second loading port 13A and 13B are arranged along the automatic transfer line L of the automatic transfer device V and also when the cassettes thereon are made to face the wafer transfer unit 14 by rotating the turntables 132, the cassettes on the turntables 132 are symmetrical with respect to the wafer transfer unit 14 and spaced apart from the wafer transfer unit 14 by a same distance. Therefore, the loading/unloading operation and time of the wafer transfer unit 14 with respect to the cassettes are substantially equally applied to each of the wafers in both cassettes. Accordingly, it is possible to suppress the wafer transfer discrepancy between the loading ports 13A and 13B and the prober chamber 12 and further to shorten the wafer transfer time in the probing apparatus 10. Moreover, due to the symmetrical arrangement of the cassettes with respect to the wafer transfer unit 14, when the wafers are transferred from the cassettes to the prober chamber 12, all of the wafers in both cassettes can be inspected with high accuracy by being transferred under the same environment (e.g., luminous intensity, humidity and the like) inside the probing apparatus 10.

Furthermore, since the sub-chuck 18 is provided under the second loading port 13B, a space provided under the second loading port 13B can be effectively used without providing a space for the sub-chuck inside the loader chamber 11.

In accordance with this embodiment, the first and the second loading port 13A and 13B are each provided with the sensor for detecting the wafers partially protruded from the cassette. Therefore, if the wafers are protruded from the cassette when transporting the cassette from the automatic transfer vehicle V to the first and the second loading port 13A and 13B, the sensors can automatically detect the release of the wafers, thus preventing various drawbacks caused by the release of the wafers.

Besides, since the first and the second loading port 13A and 13B are each provided with the pressing member 133 for pushing the wafers protruded from the cassette toward the wafer transfer unit 14, the wafers can be accurately unloaded by the wafer transfer unit 14 without being released from the cassette. In addition, the OCR 19 for identifying the wafers is provided near the sub-chuck 18, so that the space under the second loading port 13B can be effectively used for the installation space of the OCR 19.

The wafer transfer unit 14 has the first and the second elevation driving mechanism 146 and 147, so that the wafers can be precisely moved up and down by individually using the first and the second elevation driving mechanism 146 and 147. The first elevation driving mechanism 146 has the cylinder mechanisms 146C and thus can move up and down the transfer arm 141 in a short period of time. Further, the second elevation driving mechanism 147 has the ball screw 147A and the motor as a driving source thereof, so that the transfer arm 131 can be moved slightly step by step to a desired height.

In accordance with this embodiment, at the side of the probing apparatus 10, a cassette is transported from the automatic transfer vehicle V to the first loading port 13A provided at the front side in the loader chamber 11 and the cassette on the first loading port 13A is then rotated. While the wafers are transferred sheet by sheet from the cassette to the prober chamber 12, the positioning of the wafers is carried out under the second loading port 13B. Further, another cassette is transferred between the automatic transfer vehicle V and the second loading port 13B while the wafers are inspected. As a consequence, it is possible to realize the automation from the loading of the wafers into the probing apparatus 10 to the unloading of the inspected wafers therefrom. Further, since a cassette being processed is positioned on any one of the first and the second loading port 13A and 13B of the probing apparatus 10, the probing apparatus 10 can be continuously operated even when the inspection is carried out at a high speed. Consequently, the inspection efficiency can be improved.

In this embodiment, there has been described a case where an open cassette is transferred by using the automatic transfer vehicle V. However, when a FOUP (front opening unified pot) is used as the cassette, the operator may transfer the FOUP sealed by a lid onto the first and the second loading port 13A and 13B. In that case, the wafer pressing member 133 is not required, as will also be described in a third embodiment. Further, the loading ports are provided with an opener for automatically opening/closing the lid of the FOUP at the loading ports, to thereby deal with the FOUP.

Second Embodiment

Figure 9:
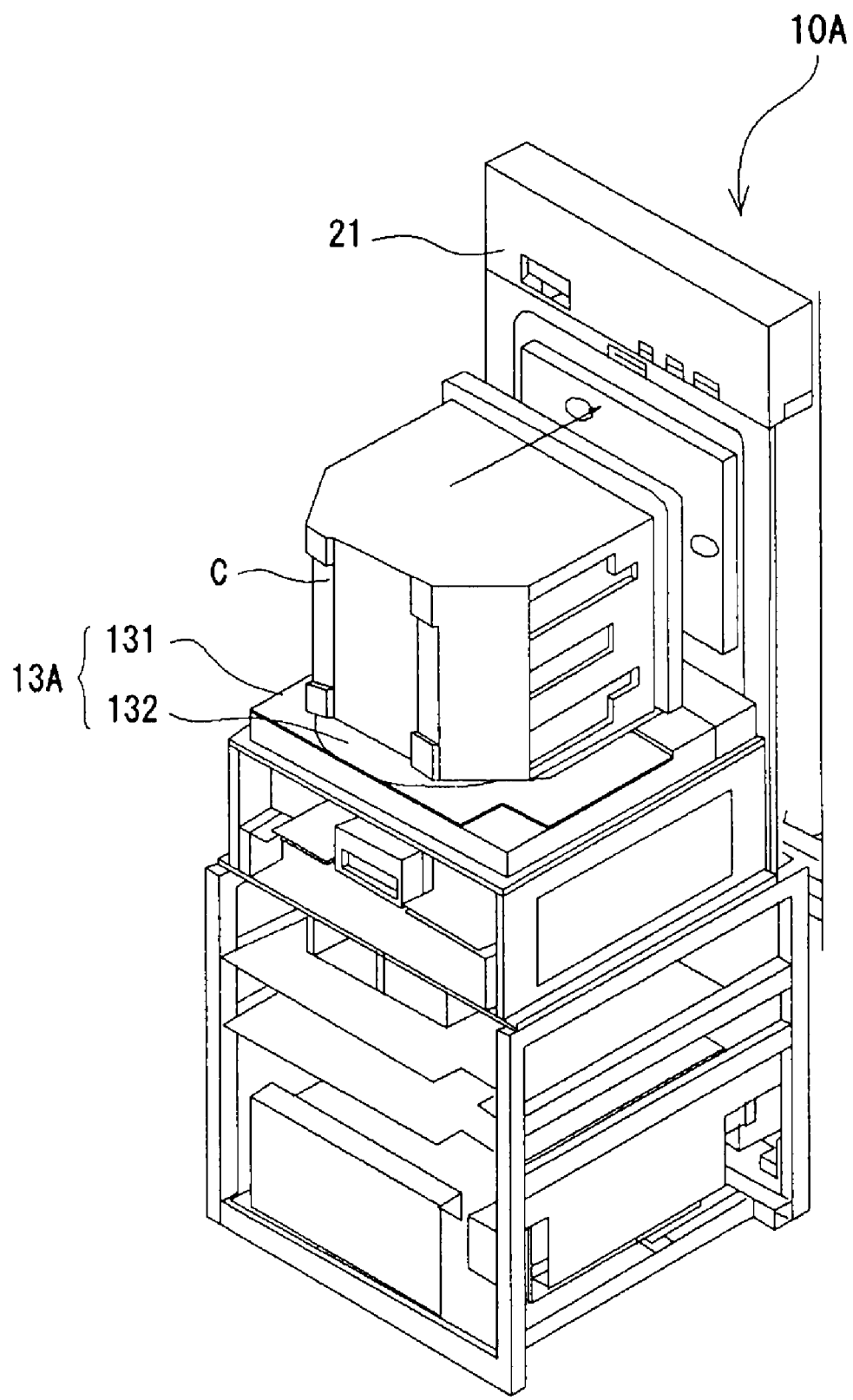
FIG. 9 is a perspective view of principal parts in a loader chamber of another embodiment of the processing apparatus of the present invention.
Figure 10:
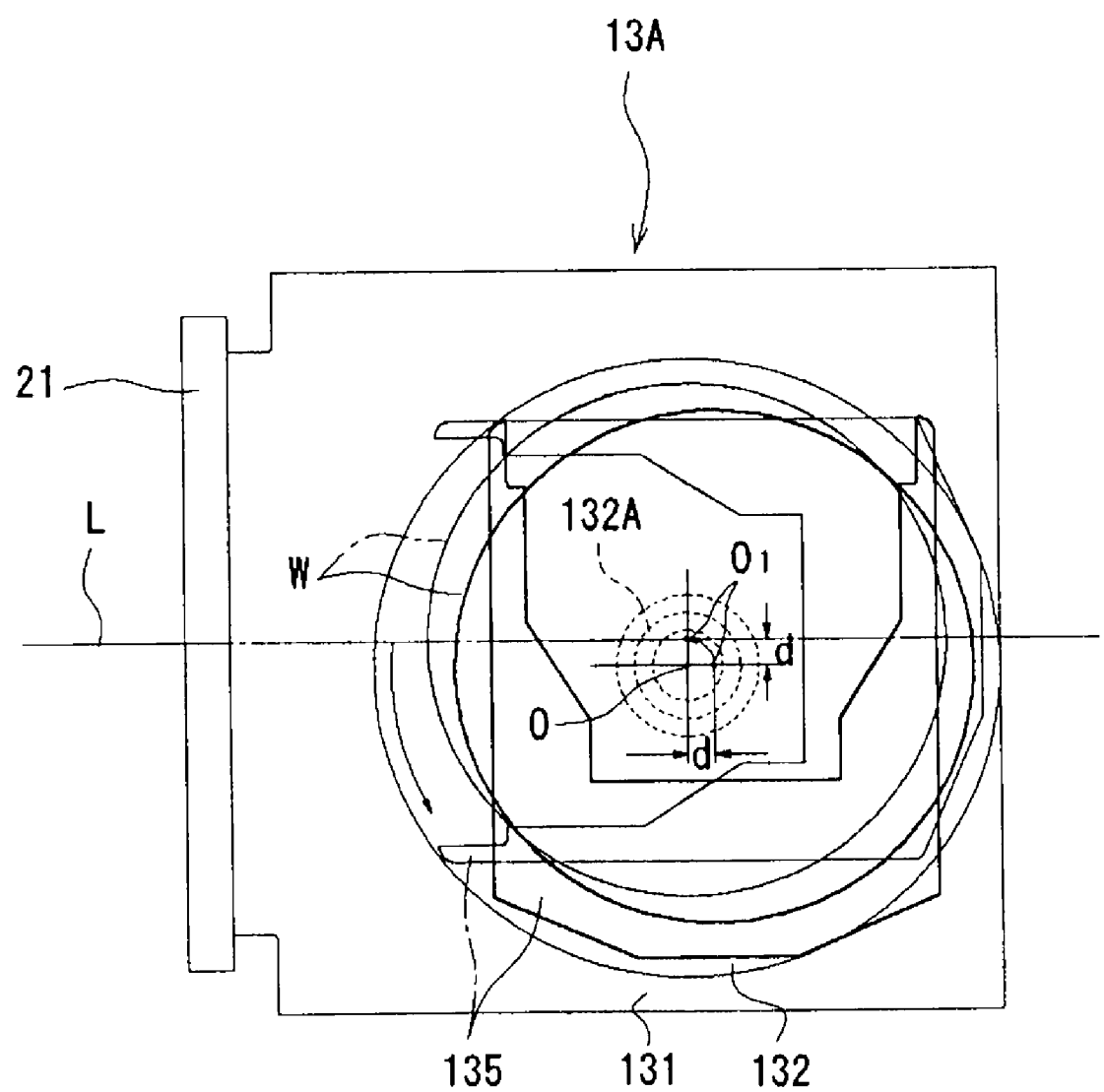
FIG. 10 is a top view for explaining a loading port shown in FIG. 9.

As shown in FIGS. 9 and 10, a probing apparatus 10A of this embodiment is substantially same as the probing apparatus 10 of the first embodiment except that: the first loading port 13A is configured to mount thereon a FOUP serving as a cassette C; there is provided an opener 21 for opening/closing a lid of the FOUP; and a buffer table 15 of this embodiment is different from that of the first embodiment. Therefore, components identical or similar to those in the first embodiment are denoted by like reference numerals, and redundant descriptions thereof will be omitted.

As can be seen from FIGS. 10 and 11, the first loading port 13A of this embodiment has the direction switching mechanism. The direction switching mechanism includes a base 131 having an opening on a top surface thereof; a turntable 132 provided at the opening of the base 131 flush with the top surface of the base 131; and a mounting portion 135 provided on the top of the turntable 132, for mounting and fixing the cassette C. The turntable 132 rotates via a rotational driving shaft 132A connected with a center of a bottom surface thereof, thereby rotating the cassette C on the mounting portion 135. A clamp mechanism (not illustrated) is attached to the mounting portion 135 and allows the cassette C to be automatically delivered to and from an AGV (automated guided vehicle) or an OHT (overhand hoist transport). Further, the clamp mechanism is configured to operate in synchronization with the AGV or the OHT.

As depicted in FIG. 10, a center O of the turntable 132 (center of the rotational driving shaft 132A) is offset by a specific distance "d" downwardly from a central line L passing through a center of a width of the opener 21. Further, the mounting portion 135 is positioned on the turntable 132, as indicated by a bold line, so that a center $O_1$ of the wafer W, indicated by a bold line, in the cassette (not shown) received from the AGV or OHT is offset by a specific distance "ID" rightwards from the center O of the turntable 132. When the turntable 132 rotates the mounting portion 135 by 90° counterclockwise via the rotational driving shaft 132A from the position indicated by the bold line to the position indicated by a fine line in FIG. 10, the center $O_1$ of the wafer W, indicated by the fine line, is positioned on the central line L and becomes closer to the opener 21 by the distance "d", compared with the state before the rotation, and the cassette C on the mounting portion 135 is made to face the opener 21. Accordingly, the cassette C becomes closer to the opener 21 via the turntable 132 by the distance "d", compared with the state before the rotation. As a result, it is possible to shorten the moving distance from the cassette C to the opener 21 by the distance "d" and further to reduce the foot print correspondingly thereto.

Although it is not illustrated, the mounting portion 135 is configured to move forwardly/backwardly on the turntable 132 through the linear driving mechanism having a guide rail and the like. Further, when the lid of the cassette C on the mounting portion 135 faces the opener 21 as shown in FIG. 10, the mounting portion 135 moves toward the opener 21 through the linear driving mechanism and, then, the lid is automatically coupled with the opener 21, as indicated by an arrow of FIG. 10. In this state, the lid of the cassette C is automatically removed and then transferred downward by the opener 21 and, thus, the loading/unloading opening of the cassette C is opened so that the wafers can be loaded and unloaded by the wafer transfer unit 14.

Figure 11A:
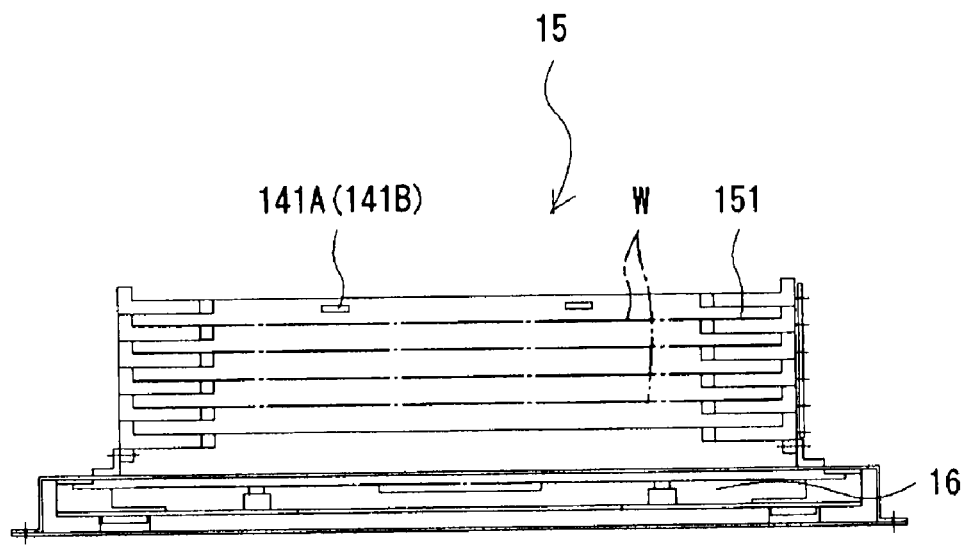

Moreover, the buffer table 15 and the wafer table 16 of FIG. 11A are arranged vertically under the first loading port 13A, as in the first embodiment. As can be seen from FIG. 11A, the buffer table 15 has slots 151 for supporting needle-tip grinding wafers $W_1$ or wafers W having a same diameter (e.g., 300 mm φ), the slots 151 being vertically spaced apart from each other at regular intervals in multiple stages. As depicted in FIG. 11A, the slots 151 can be provided in multiple stages even in a limited space since the needle-tip grinding wafers $W_1$ or the wafers W having a same diameter are accommodated in the slots 151. Therefore, even when the number of chips remarkably increases in larger wafers and thus needle tips of a probe card need to be frequently grinded, a plurality of needle-tip grinding wafers $W_1$ accommodated in the buffer table 15 can be consecutively used to perform the frequent grinding operations.

On the other hand, in the conventional buffer table and the buffer table of the first embodiment, they accommodate therein needle-tip grinding wafers having different diameters, needle-tip grinding wafers having a same diameter cannot be accommodated therein. In some cases, the needle-tip grinding wafers need to be exchanged while stopping the apparatus, which deteriorates the throughput.

Figure 11B:
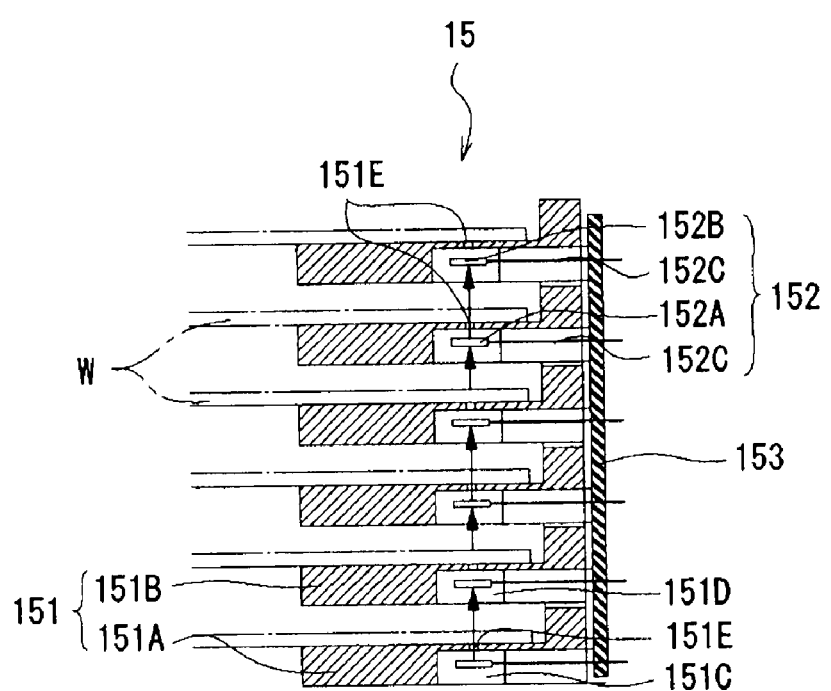

As depicted in FIG. 11B, each of the slots 151 of the buffer table 15 is formed of brackets 151A and 151B arranged vertically. Each of the slots 151 is provided with an optical sensor 152 for detecting presence of the needle-tip grinding wafers $W_1$ or the like. By using the optical sensor 152, it is possible to check each of the needle-tip grinding wafers $W_1$ accommodated by the slots 151. The optical sensor 152 has a light emitting element 152A and a light receiving element 152B, and is connected with a wiring board 153 via wirings 152C. The lower bracket 151A has a space 151C for accommodating therein the light emitting element 152A, and the upper bracket 151B has a space 152D for accommodating therein the light receiving element 152B. Further, each of the brackets 151C has an opening 151E for allowing rays from the light emitting element 152A to pass therethrough. The optical sensors 152 of the slots 151 are arranged alternately in the forward/backward direction of the slots 151 in such a way that vertically adjacent optical sensors 152 are not overlapped with each other.

Accordingly, the optical sensor 152 detects presence of a needle-tip grinding wafer $W_1$ in the corresponding slot 151 without detecting presence of a needle-tip grinding wafer $W_1$ accommodated in the slot 151 above that. In other words, rays of vertically adjacent optical sensors 152 are not interfered with each other. By using the optical sensors 152 provided at the slots 151, it is possible to accurately detect the needle-tip grinding wafers $W_1$ accommodated in the slots 151 and specify types of the wafers supported by the slots 151.

As described above, in accordance with this embodiment, the first loading port 13A has the mounting portion 135 for mounting thereon the cassette C; and the turntable 132 for rotating the mounting portion 135. The center $O_1$ of the wafers W in the cassette C is offset by the distance "d" from the center O of the turntable 132 and, also, the mounting portion 135 is eccentrically rotated. Therefore, when the turntable 132 rotates eccentrically the cassette C received from the AGV or OHT, the cassette C becomes closer to the opener 21 by the distance "d" and faces the opener 21. As a result, it is possible to shorten the moving distance from the cassette C to the opener 21 by the distance "d" and to reduce the foot print correspondingly thereto.

Besides, in accordance with this embodiment, the buffer table 15 having the slots 151 for supporting needle-tip grinding wafers $W_1$ of a same diameter (e.g., 300 mm φ) is provided under the first loading port 13A, the slots 151 being arranged in multiple stages vertically. Therefore, a plurality of needle-tip grinding wafers $W_1$ of a same diameter can be accommodated in the buffer table 15. Accordingly, even when the number of chips to be inspected remarkably increases in wafers of 300 mm φ and thus needle tips of a probe card need to be frequently grinded, a plurality of needle-tip grinding wafers $W_1$ can be consecutively used to perform the grinding operations, thereby improving the throughput of the inspection. Moreover, by using the optical sensor 152 provided at each of the slots 151 of the buffer table 15, it is possible to detect presence of the needle-tip grinding wafer $W_1$ in each of the slots 151. Further, by defining a corresponding relationship between the slots 151 and the optical sensors 152, it is possible to specify the type of the needle-tip grinding wafer $W_1$ accommodated in each of the slots 151. In addition, the effects of the first embodiment can also be obtained with this embodiment.

Third Embodiment

Figure 12:
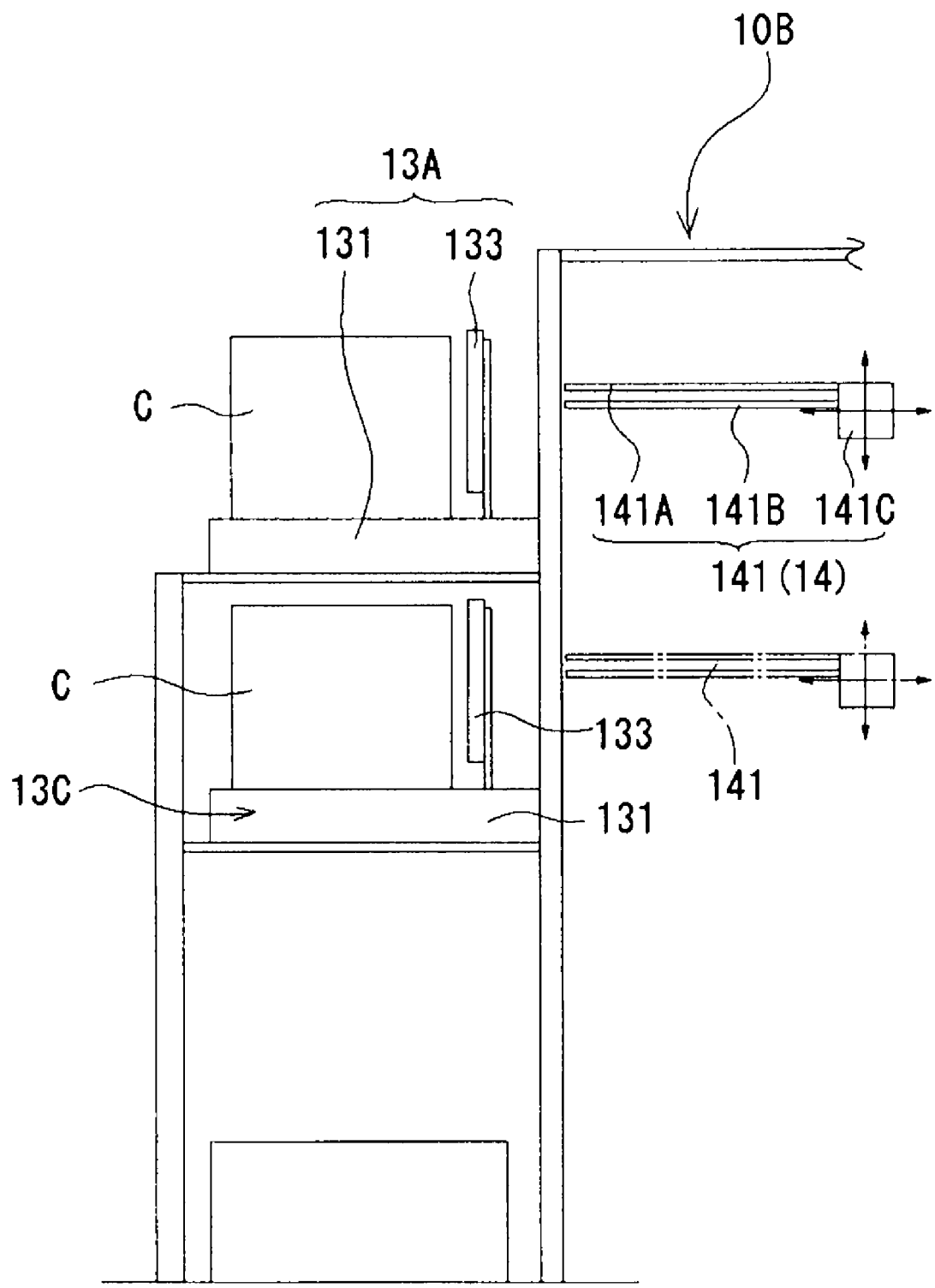
FIG. 12 depicts a side view of principal parts in a modification of the probing apparatus of FIG. 1.
Figure 13A:
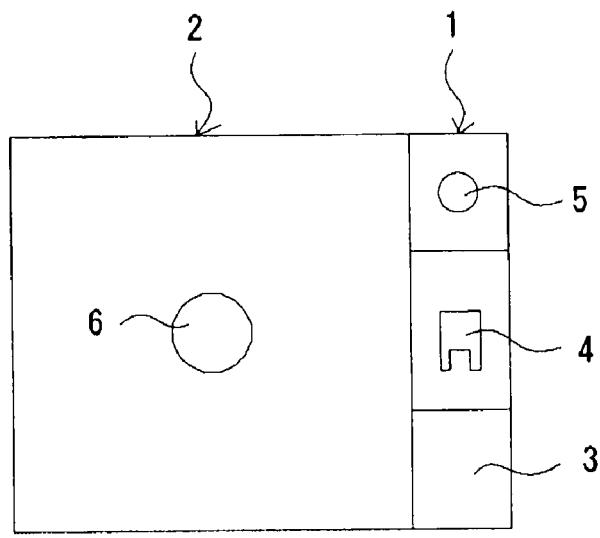
FIGS. 13A and 13B depict a top view of a configuration of a conventional probing apparatus and a top view of a configuration in which an additional loading port is added to the conventional probing apparatus, respectively.
Figure 13B:
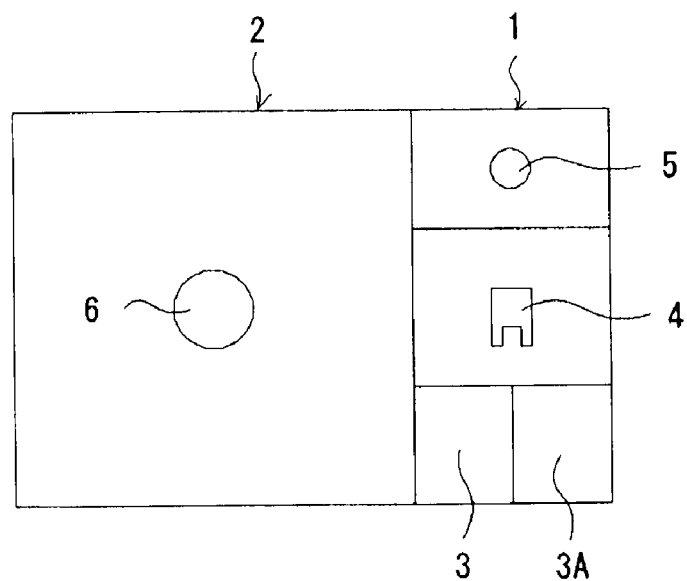

A probing apparatus 10B of this embodiment is substantially same as the probing apparatus 10 of the first embodiment except that a third loading port 13C is provided under the first loading port 13A so that a cassette C can be accommodated in each of the first and the third loading port 13A and 13C arrange vertically, as illustrated in FIG. 12. Therefore, components identical or similar to those in the first embodiment are denoted by like reference numerals, and redundant descriptions thereof will be omitted.

In other words, as shown in FIG. 12, the third loading port 13C is disposed under the first loading port 13A and has a substantially same structure as those of the first and the second loading port 13A and 13B. In the wafer transfer unit 14, the transfer arm 141 is raised/lowered through a first and a second elevation driving mechanism (not shown) to face the first or the third loading port 13A or 13C, and the wafers are loaded into and unloaded from the cassette C. When the wafers are loaded into and unloaded from the cassette C on the first loading port 13A, the transfer arm 141 is raised to a position facing the first loading port 13A through the first elevation driving mechanism, as indicated by a solid line of FIG. 12. Then, the transfer arm 141 is moved up and down between the lower and the upper end of the cassette C through the second elevation driving mechanism, thereby loading and unloading the wafers into and from the cassette C, as in the first embodiment. Meanwhile, when the wafers are loaded/unloaded with respect to the cassette C on the third loading port 13C, only the second elevation driving mechanism is driven. Accordingly, the transfer arm 141 is made to face the third loading port 13C, as indicated by a dashed dotted line of FIG. 12. Thereafter, the transfer arm 141 is raised/lowered between the top and the bottom stage of the cassette C through the second elevation driving mechanism, thereby loading/unloading the wafers. After the wafers are unloaded from the cassette C by the transfer arm 141, the unloaded wafers are transferred to the processing chamber, as in the first embodiment. Then, the wafers that have been subjected to a specific process in the processing chamber are transferred from the processing chamber into the cassette C.

In accordance with this embodiment, the additional loading port is provided in comparison with the first and the second embodiment, so that an additional cassette C can be accommodated in the probing apparatus 10A. Moreover, even if the wafer inspection time is shortened, the wafers can be processed continuously, thus improving a throughput. In addition, the effects of the first embodiment can also be obtained with this embodiment.

In the third embodiment, although two loading ports arranged vertically are provided at the front side of the wafer transfer unit, two loading ports arranged vertically may also be provided at the rear side of the wafer transfer unit. Moreover, the first loading port may be provided with an additional cassette elevation mechanism. In this case, an elevation stroke of the transfer arm can be reduced.

The present invention is not limited to the aforementioned embodiments, and each component thereof may be appropriately modified as desired.

The present invention can be widely used for various processing apparatuses installed in a clean room of a semiconductor manufacturing factory.

While the invention has been shown and described with respect to the embodiments, it will be understood by those skilled in the art that various changes and modification may be made without departing from the scope of the invention as defined in the following claims.

What is claimed is:

1. A probing apparatus comprising:
   a prober chamber in which target objects are inspected; and
   a loader chamber disposed at a side surface of the prober chamber, wherein the loader chamber includes: two loading ports positioned to be spaced apart from each other along the side surface, each of the loading ports mounting thereon a cassette accommodating therein a plurality of the target objects; and a transfer unit provided between the loading ports, the transfer unit transferring the target objects between the loading ports and the prober chamber, wherein the loading ports are disposed along a route where the cassette is transferred by an automatic transfer device, and wherein each of the loading ports has a direction switching mechanism for switching a direction of the cassette.

2. The probing apparatus of claim 1, wherein each of the loading ports is provided with a sensor for detecting target objects protruded from the cassette.

3. The probing apparatus of claim 2, wherein each of the loading ports is provided with a pressing member for pushing the target objects protruded from the cassette thereinto.

4. The probing apparatus of claim 1, wherein the cassette has a lid for closing a loading/unloading opening for the target objects, and each of the loading ports is provided with an opening/closing mechanism for opening and closing the lid of the cassette.

5. The probing apparatus of claim 1, wherein a positioning mechanism for positioning the target objects is provided under any one of the two loading ports.

6. The probing apparatus of claim 5, wherein an identification unit for identifying the target objects is provided near the positioning mechanism.

7. The probing apparatus of claim 5, wherein a receiving body having supporting portions for supporting same-sized substrates is provided under the other one of the two loading ports, the supporting portions being arranged in multiple stages vertically.

8. The probing apparatus of claim 7, wherein each of the supporting portions has a sensor for detecting presence of the substrate.

9. The probing apparatus of claim 1, wherein the direction switching mechanism has a mounting portion for mounting thereon the cassette; and a rotational body for rotating the mounting portion, wherein a center of the target objects in the cassette is offset from a center of the rotational body by a specific distance, and the mounting portion is eccentrically rotated by the rotational body.

10. The probing apparatus of claim 9, wherein when the rotational body is rotated to make the lid of the cassette face the opening/closing mechanism, the cassette becomes closer to a position where it is opened and closed by the opening/closing mechanism by the specific distance.

11. The probing apparatus of claim 9, wherein the rotational body is rotatable by 90°.

12. The probing apparatus of claim 1, wherein the transfer unit has a first and a second elevation driving mechanism.

13. The probing apparatus of claim 12, wherein the first elevation driving mechanism has an air cylinder, and the second elevation driving mechanism has a motor.

14. A probing apparatus comprising:

a prober chamber in which target objects are inspected; and a loader chamber disposed at a side surface of the prober chamber, wherein the loader chamber includes: two loading ports positioned to be spaced apart from each other along the side surface, each of the loading ports mounting thereon a cassette accommodating therein a plurality of the target objects; and a transfer unit provided between the loading ports, the transfer unit transferring the target objects between the loading ports and the prober chamber, wherein the loading ports are disposed along a route where the cassette is transferred by an automatic transfer device, and wherein each of the loading ports is provided with a sensor for detecting target objects protruded from the cassette.

15. The probing apparatus of claim 14, wherein each of the loading ports is provided with a pressing member for pushing the target objects protruded from the cassette thereinto.

16. The probing apparatus of claim 14, wherein a positioning mechanism for positioning the target objects is provided under any one of the two loading ports.

17. The probing apparatus of claim 16, wherein a receiving body having supporting portions for supporting same-sized substrates is provided under the other one of the two loading ports, the supporting portions being arranged in multiple stages vertically.

18. The probing apparatus of claim 17, wherein each of the supporting portions has a sensor for detecting presence of the substrate.

19. The probing apparatus of claim 14, wherein the transfer unit has a first and a second elevation driving mechanism.

20. The probing apparatus of claim 19, wherein the first elevation driving mechanism has an air cylinder, and the second elevation driving mechanism has a motor.

* * * * *